(12) United States Patent
Chang et al.

(10) Patent No.: US 11,694,972 B2
(45) Date of Patent: Jul. 4, 2023

(54) SEMICONDUCTOR PACKAGE WITH HEATSINK

(71) Applicant: MEDIATEK INC., Hsin-Chu (TW)

(72) Inventors: Kuang-Han Chang, Hsinchu (TW); Yu-Liang Hsiao, Hsinchu (TW); Chih-An Yang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 60 days.

(21) Appl. No.: 17/336,331

(22) Filed: Jun. 2, 2021

(65) Prior Publication Data
US 2021/0384142 A1 Dec. 9, 2021

Related U.S. Application Data

(60) Provisional application No. 63/036,523, filed on Jun. 9, 2020.

(51) Int. Cl.
*H01L 23/367* (2006.01)
*H01L 23/552* (2006.01)
*H01L 23/498* (2006.01)
*H01L 23/00* (2006.01)

(52) U.S. Cl.
CPC ........ *H01L 23/552* (2013.01); *H01L 23/3675* (2013.01); *H01L 23/49816* (2013.01); *H01L 23/49838* (2013.01); *H01L 24/16* (2013.01); *H01L 24/48* (2013.01); *H01L 2224/16225* (2013.01); *H01L 2224/48225* (2013.01); *H01L 2924/15311* (2013.01); *H01L 2924/1632* (2013.01); *H01L 2924/16196* (2013.01); *H01L 2924/3025* (2013.01)

(58) Field of Classification Search
CPC .............. H01L 23/552; H01L 23/3675; H01L 23/49816; H01L 23/49838; H01L 24/16; H01L 24/48; H01L 2224/16225; H01L 2224/48225; H01L 2924/15311; H01L 2924/16196; H01L 2924/1632; H01L 2924/3025; H01L 24/32; H01L 24/73; H01L 2224/32225; H01L 2224/48091; H01L 2224/48227; H01L 2224/73265; H01L 2924/00014; H01L 2924/181; H01L 23/4334
See application file for complete search history.

(56) References Cited

U.S. PATENT DOCUMENTS

| 6,528,876 | B2 | 3/2003 | Huang | |
|---|---|---|---|---|
| 2002/0079593 | A1* | 6/2002 | Huang | ................ H01L 23/4334 257/E23.105 |
| 2005/0104164 | A1 | 5/2005 | Awujoola | |
| 2015/0129874 | A1 | 5/2015 | Choi | |
| 2016/0300812 | A1 | 10/2016 | Chen | |

(Continued)

*Primary Examiner* — Elias Ullah
(74) *Attorney, Agent, or Firm* — Winston Hsu

(57) ABSTRACT

A semiconductor package includes a substrate, a semiconductor die mounted on the substrate, and a heatsink over the semiconductor die. The heatsink includes a roof portion and at least one connecting portion extending between the roof portion and the substrate. The at least one connecting portion includes a connection lead mounted on a connection pad of the substrate. The connection pad includes a first portion and a second portion spaced apart from each other, which are configured to electrically couple to different voltage signals, respectively, for detecting heatsink floating.

17 Claims, 2 Drawing Sheets

(56) References Cited

U.S. PATENT DOCUMENTS

2017/0265339 A1 9/2017 Kim
2019/0244912 A1 8/2019 Takano
2020/0135609 A1 4/2020 Lin

* cited by examiner

SEMICONDUCTOR PACKAGE WITH HEATSINK

CROSS REFERENCE TO RELATED APPLICATIONS

This application claims priority from U.S. provisional application No. 63/036,523 filed on Jun. 9, 2020, the disclosure of which is included in its entirety herein by reference.

BACKGROUND

The present disclosure relates generally to the field of semiconductor technology. More particularly, the present disclosure relates to an improved semiconductor package with a heatsink.

VLSI integrated circuits packages having high connection capacity are pin grid array (PGA) and ball grid array (BGA). One such package type is plastic ball grid array (PBGA). The PBGA offers many advantages over conventional packages such as solder ball I/O and high speed. The PBGA package has high speed due to a short path for signal transformation. The solder balls are set on a package surface in a matrix array which can provide more signal contacts.

When the PBGA product is operated, considerable heat is generated in the integrated circuit chip. Typically, a heatsink is installed to effectively radiate the heat to the outside. In addition, the heatsink exhibits a ground effect for electromagnetic (EM) shielding. However, the heatsink floating, which is conventionally difficult to detect, may deteriorate the efficiency of spreading heat of the PBGA product and the EM shielding performance. Therefore, there is need in this industry to provide an improved semiconductor package with heatsink capable of detecting heatsink floating during the final testing.

SUMMARY

It is one object of the invention to provide an improved semiconductor package with a heatsink to solve the above-mentioned deficiencies or shortcomings.

According to one aspect of the invention, a semiconductor package includes a substrate, a semiconductor die mounted on the substrate, and a heatsink over the semiconductor die. The heatsink includes a roof portion and at least one connecting portion extending between the roof portion and the substrate. The at least one connecting portion includes a connection lead mounted on a connection pad of the substrate. The connection pad includes a first portion and a second portion spaced apart from each other, which are configured to electrically couple to different voltage signals, respectively.

According to some embodiments, the roof portion is a rectangular shaped roof portion, and wherein the at least one connecting portion extends from a corner of the rectangular shaped roof portion.

According to some embodiments, the roof portion has a planar top surface.

According to some embodiments, the connection lead is attached to both the first portion and the second portion of the connection pad.

According to some embodiments, the connection lead is attached to the first portion through a first conductive adhesion layer and is attached to the second portion through a second conductive adhesion layer.

According to some embodiments, the semiconductor package further comprises a solder mask between the connection lead and the connection pad and a first solder mask opening in the solder mask to partially expose a top surface of the first portion of the connection pad. The first conductive adhesion layer is disposed in the first solder mask opening. A second solder mask opening is disposed in the solder mask to partially expose a top surface of the second portion of the connection pad. The second conductive adhesion layer is disposed in the second solder mask opening.

According to some embodiments, the first conductive adhesion layer is not in direct with the second conductive adhesion layer.

According to some embodiments, the first conductive adhesion layer and the second conductive adhesion layer are conductive epoxy layers.

According to some embodiments, the first portion of the connection pad is electrically coupled to reserved $V_{DD}$ voltage and the second portion of the connection pad is electrically coupled to $V_{SS}$ voltage or ground.

According to some embodiments, the substrate comprises a package substrate.

According to some embodiments, the connection pad is disposed on a chip side of the substrate, and wherein the substrate comprises a solder ball pad disposed on a ball grid array (BGA) side.

According to some embodiments, a solder ball is mounted on the solder ball pad. The connection pad is electrically connected to the solder ball pad through at least one metal interconnect structure in the substrate.

According to some embodiments, the at least one metal interconnect structure is a conductive through via, and wherein the solder ball pad is disposed directly under the connection pad.

According to some embodiments, the substrate comprises a ground plane.

According to some embodiments, the second portion of the connection pad is electrically coupled to the ground plane.

According to some embodiments, the semiconductor die is mounted on the substrate through wire bonding.

According to some embodiments, the semiconductor die is mounted on the substrate through flip chip bonding.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

Figure 1:
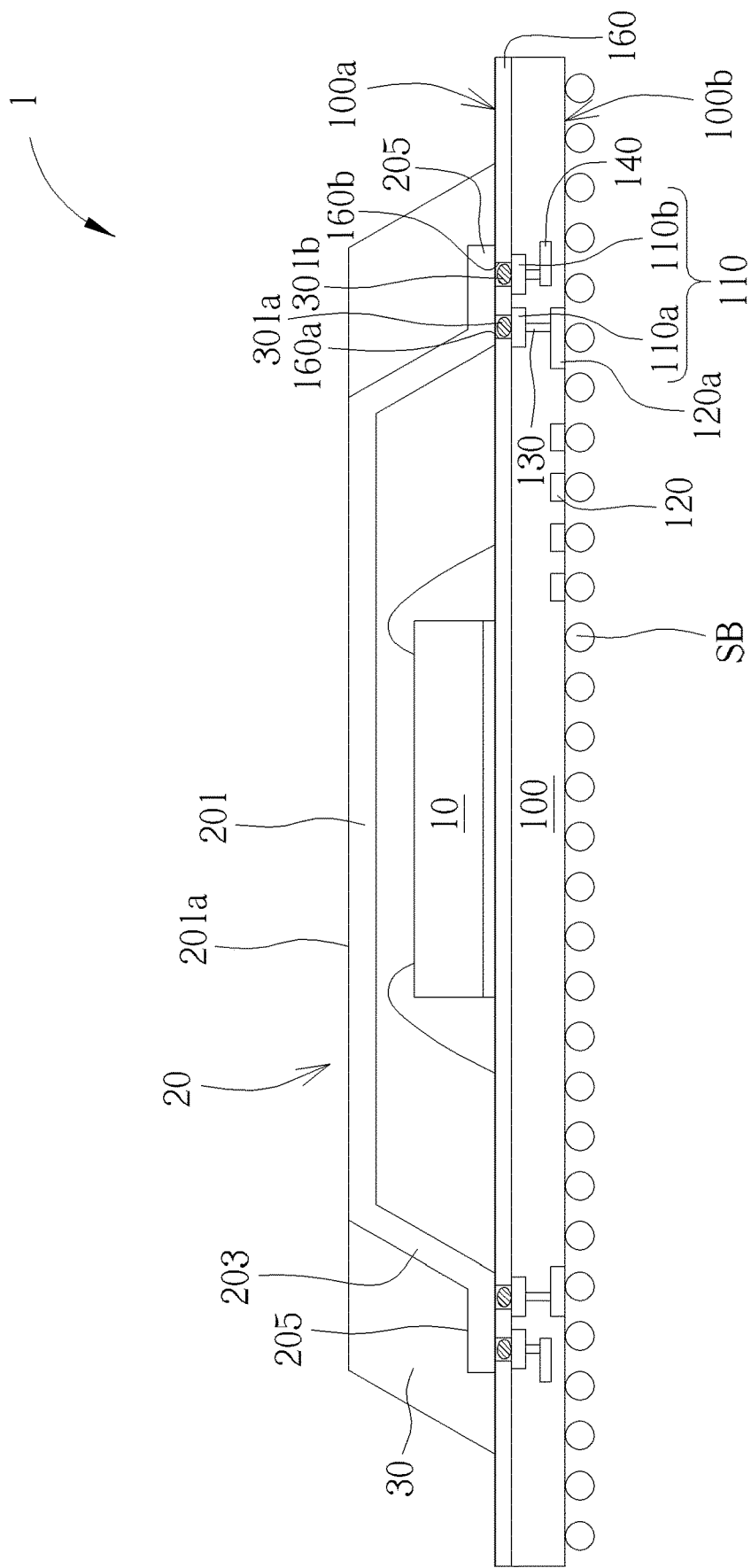
FIG. 1 is a schematic, cross-sectional diagram showing a semiconductor package according to one embodiment of the invention.

In the following detailed description of embodiments of the invention, reference is made to the accompanying drawings, which form a part hereof, and in which is shown by way of illustration specific preferred embodiments in which the disclosure may be practiced. These embodiments are described in sufficient detail to enable those skilled in the art to practice them, and it is to be understood that other embodiments may be utilized and that mechanical, structural, and procedural changes may be made without departing from the spirit and scope of the present disclosure. The following detailed description is, therefore, not to be taken in a limiting sense, and the scope of embodiments of the present invention is defined only by the appended claims.

It will be understood that, although the terms first, second, third, primary, secondary, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first or primary element, component, region, layer or section discussed below could be termed a second or secondary element, component, region, layer or section without departing from the teachings of the present inventive concept.

Spatially relative terms, such as "beneath", "below", "lower", "under", "above," "upper," "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" or "over" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, and may be abbreviated as "/".

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

It is noted that: (i) same features throughout the drawing figures will be denoted by the same reference label and are not necessarily described in detail in every drawing that they appear in, and (ii) a sequence of drawings may show different aspects of a single item, each aspect associated with various reference labels that may appear throughout the sequence, or may appear only in selected drawings of the sequence.

The present invention pertains to an improved semiconductor chip package with a heatsink, such as a plastic ball grid array (PBGA) package. The connection lead of the heatsink is mounted on a connection pad of a substrate. The connection pad is split into two portions including a first portion and a second portion, which are spaced apart from each other and arranged in close proximity to each other. The first portion and the second portion are configured to electrically couple to different voltage signals, respectively, such that the heatsink floating can be detected during the final testing.

Figure 2:
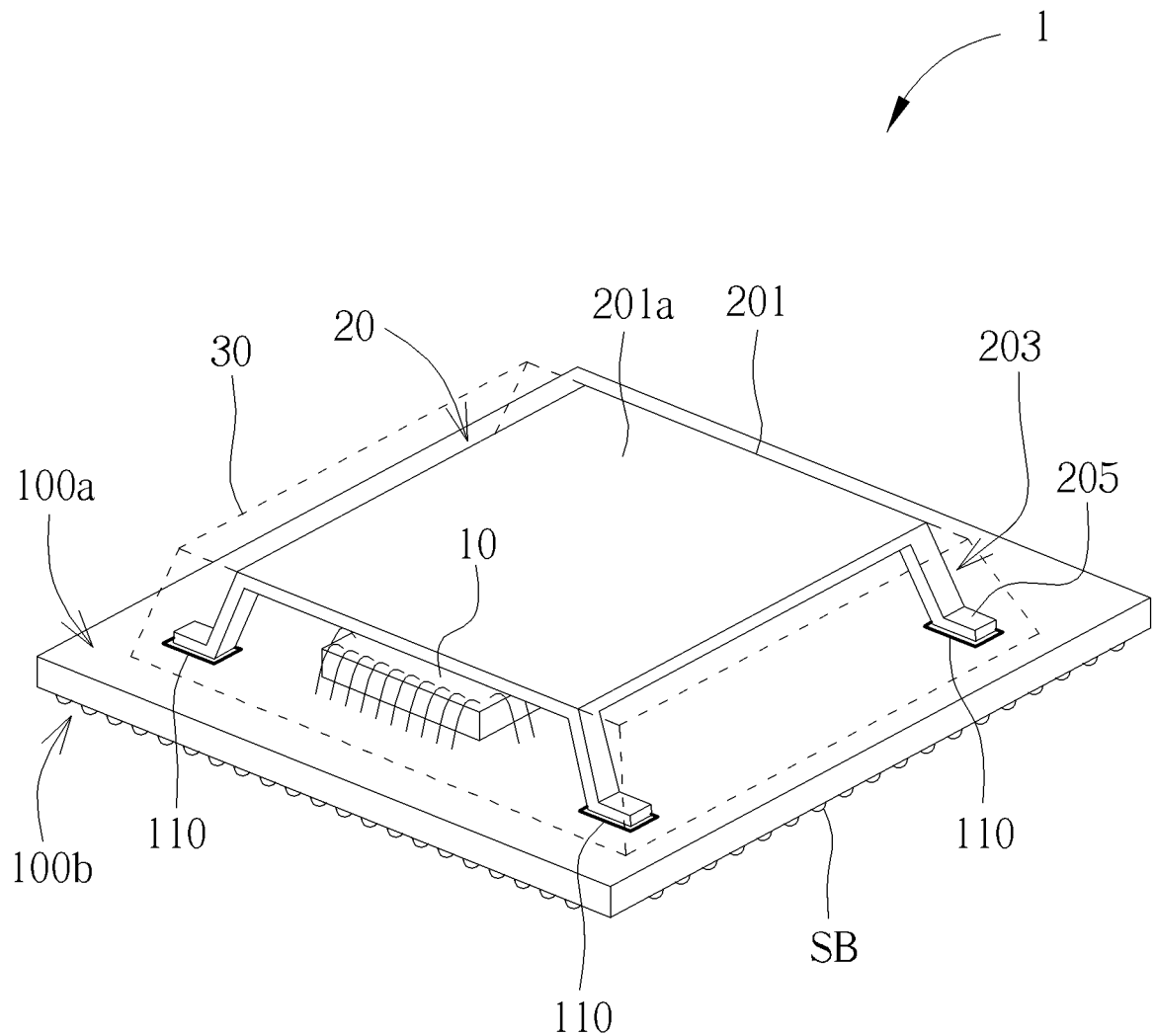
FIG. 2 is a schematic, perspective view of the semiconductor package in FIG. 1.

Please refer to FIG. 1 and FIG. 2. FIG. 1 is a schematic, cross-sectional diagram showing a semiconductor package 1 according to one embodiment of the invention. FIG. 2 is a schematic, perspective view of the semiconductor package 1 in FIG. 1. As shown in FIG. 1 and FIG. 2, the semiconductor package 1 comprises a substrate 100 such as a package substrate or a printed circuit substrate, but not limited thereto. According to an embodiment, the substrate 100 comprises a chip side 100a and a ball grid array (BGA) side 100b. According to an embodiment, a semiconductor die 10 is mounted on the chip side 100a of the substrate 100.

According to some embodiments, the semiconductor die 10 may be mounted on the substrate 100 through wire bonding. According to another embodiment, the semiconductor die 10 may be mounted on the substrate 100 through flip chip bonding manner with conductive bumps or conductive pillar structures.

According to an embodiment, an array of solder ball pads 120 is disposed on the BGA side 100b of the substrate 100. According to an embodiment, solder balls SB are mounted on the solder ball pads 120, respectively.

As shown in FIG. 1 and FIG. 2, according to an embodiment, a heatsink 20 is disposed over the semiconductor die 10. An encapsulant 30 such as a molding compound may be disposed around the heatsink 20 and may seal the space between the heatsink 20 and the substrate 100 so as to protect the semiconductor die 10.

The heatsink 20 includes a roof portion 201 and at least one connecting portion 203 extending between the roof portion 201 and the substrate 100. According to an embodiment, the roof portion 201 may be a rectangular shaped roof portion. According to an embodiment, the roof portion 201 has a planar top surface 201a, which may be exposed from the encapsulant 30.

According to an embodiment, four exemplary connecting portions 203 extend from four corners of the rectangular shaped roof portion 201, respectively. According to an embodiment, each of the four connecting portions 203 includes a connection lead 205 mounted on a connection pad 110 of the substrate 100 on the chip side 100a. The connection pad 110 includes a first portion 110a and a second portion 110b spaced apart from each other.

According to an embodiment, the first portion 110a and the second portion 110b are arranged in close proximity to each other. According to an embodiment, the first portion 110a and the second portion 110b are configured to electrically couple to different voltage signals, respectively. According to an embodiment, the first portion 110a of the connection pad 100 may be electrically coupled to a reserved $V_{DD}$ voltage and the second portion 110b of the connection pad 110 may be electrically coupled to $V_{SS}$ voltage or ground.

According to an embodiment, the connection lead 205 is attached to both the first portion 110a and the second portion 110b of the connection pad 100. According to an embodiment, the connection lead 205 is attached to the first portion 110a through a first conductive adhesion layer 301a and is attached to the second portion 110b through a second conductive adhesion layer 301b. According to an embodiment, the first conductive adhesion layer 301a and the second conductive adhesion layer 301b may comprise a conductive epoxy layer.

According to an embodiment, the semiconductor package 1 further comprises a solder mask 160 between the connection lead 202 and the connection pad 110. According to an embodiment, a first solder mask opening 160a is disposed in the solder mask 160 to partially expose a top surface of the first portion 110a of the connection pad 110. The first conductive adhesion layer 301a is disposed in the first solder mask opening 160a.

According to an embodiment, a second solder mask opening 160b is disposed in the solder mask 160 to partially expose a top surface of the second portion 110b of the connection pad 110. The second conductive adhesion layer 301b is disposed in the second solder mask opening 160b. According to an embodiment, the first conductive adhesion layer 301a is not in direct with the second conductive adhesion layer 301b.

According to an embodiment, the first portion 110a of the connection pad 110 is electrically connected to the solder ball pad 120a through at least one metal interconnect structure 130 in the substrate 100. According to an embodiment, the at least one metal interconnect structure 130 may comprise a conductive through via. According to an embodiment, the solder ball pad 120a is disposed directly under the connection pad 110.

According to an embodiment, the substrate 100 comprises a ground plane 140. According to an embodiment, the second portion 110b of the connection pad 110 is electrically coupled to the ground plane 140. During the final testing process, as described above, the first portion 110a of the connection pad 100 may be electrically coupled to a reserved $V_{DD}$ (RSVD) voltage and the second portion 110b of the connection pad 110 may be electrically coupled to $V_{SS}$ voltage or ground. A significant resistance value can be detected during the final testing if any heatsink floating occurs. With the above-described structure of the present invention, by testing whether the first portion 110a and the second portion 110b are floating, it can be confirmed whether the heatsink 20 is well connected to the substrate 100.

It is advantageous to use the present invention because the heatsink floating or detachment can be detected during the final testing stage of the chip manufacturing process. When the heatsink floating occurs, a high resistance signal can be detected through the solder ball pad 120a. By providing such configuration, the heatsink 20 can be well connected to ground through a shortest path and a good EMI shielding can be maintained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
    a substrate;
    a semiconductor die mounted on the substrate; and
    a heatsink over the semiconductor die, wherein the heatsink comprises a roof portion and at least one connecting portion extending between the roof portion and the substrate, wherein the at least one connecting portion comprises a connection lead mounted on and electrically connected to a split connection pad of the substrate, wherein the split connection pad comprises a first portion and a second portion spaced apart from each other, wherein the first portion is coplanar with the second portion, and wherein the first portion is electrically connected to a first voltage signal, and the second portion is electrically connected to a second voltage signal that is different from the first voltage signal.

2. The semiconductor package according to claim 1, wherein the roof portion is a rectangular shaped roof portion, and wherein the at least one connecting portion extends from a corner of the rectangular shaped roof portion.

3. The semiconductor package according to claim 1, wherein the roof portion has a planar top surface.

4. The semiconductor package according to claim 1, wherein the connection lead is attached to both the first portion and the second portion of the connection pad.

5. The semiconductor package according to claim 1, wherein the connection lead is attached to the first portion through a first conductive adhesion layer and is attached to the second portion through a second conductive adhesion layer.

6. The semiconductor package according to claim 5 further comprising:
    a solder mask between the connection lead and the connection pad;
    a first solder mask opening in the solder mask to partially expose a top surface of the first portion of the connection pad, wherein the first conductive adhesion layer is disposed in the first solder mask opening; and
    a second solder mask opening in the solder mask to partially expose a top surface of the second portion of the connection pad, wherein the second conductive adhesion layer is disposed in the second solder mask opening.

7. The semiconductor package according to claim 5, wherein the first conductive adhesion layer is not in direct with the second conductive adhesion layer.

8. The semiconductor package according to claim 5, wherein the first conductive adhesion layer and the second conductive adhesion layer are conductive epoxy layers.

9. The semiconductor package according to claim 1, wherein the first portion of the connection pad is electrically coupled to reserved $V_{DD}$ voltage and the second portion of the connection pad is electrically coupled to $V_{SS}$ voltage or ground.

10. The semiconductor package according to claim 9, wherein the substrate comprises a ground plane.

11. The semiconductor package according to claim 10, wherein the second portion of the connection pad is electrically coupled to the ground plane.

12. The semiconductor package according to claim 1, wherein the substrate comprises a package substrate.

13. The semiconductor package according to claim 1, wherein the connection pad is disposed on a chip side of the substrate, and wherein the substrate comprises a solder ball pad disposed on a ball grid array (BGA) side.

14. The semiconductor package according to claim 13, wherein a solder ball is mounted on the solder ball pad, and wherein the connection pad is electrically connected to the solder ball pad through at least one metal interconnect structure in the substrate.

15. The semiconductor package according to claim 14, wherein the at least one metal interconnect structure is a conductive through via, and wherein the solder ball pad is disposed directly under the connection pad.

16. The semiconductor package according to claim 1, wherein the semiconductor die is mounted on the substrate through wire bonding.

17. The semiconductor package according to claim 1, wherein the semiconductor die is mounted on the substrate through flip chip bonding.

* * * * *